United States Patent [19]

Murakami

[11] Patent Number: 5,047,366
[45] Date of Patent: Sep. 10, 1991

[54] METHOD OF DIFFUSING SILICON INTO COMPOUND SEMICONDUCTORS AND COMPOUND SEMICONDUCTOR DEVICES

[75] Inventor: Takashi Murakami, Itami, Japan

[73] Assignee: Mitsubishi Denki Kabushiki Kaisha, Japan

[21] Appl. No.: 264,142

[22] Filed: Oct. 28, 1988

[30] Foreign Application Priority Data

Nov. 4, 1987 [JP] Japan ............................. 62-278530

[51] Int. Cl.$^5$ ............................................ H01L 21/225
[52] U.S. Cl. ................................... 437/160; 437/987; 437/141; 148/DIG. 34; 372/45
[58] Field of Search ................ 437/160, 987; 372/45, 372/50; 148/DIG. 160, DIG. 34

[56] References Cited

U.S. PATENT DOCUMENTS

| | | | |
|---|---|---|---|
| 4,680,768 | 7/1987 | Yagi | 372/45 |
| 4,727,556 | 2/1988 | Burnham et al. | 372/45 |
| 4,731,789 | 3/1988 | Thornton | 372/45 |
| 4,830,983 | 5/1989 | Thornton | 437/987 |
| 4,847,217 | 7/1989 | Omura et al. | 437/160 |

FOREIGN PATENT DOCUMENTS

| | | |
|---|---|---|
| 0225772 | 6/1987 | European Pat. Off. |
| 58-197786 | 11/1983 | Japan |
| 006586 | 1/1984 | Japan |
| 123288 | 7/1984 | Japan |

OTHER PUBLICATIONS

Omura Wu et al, "Silicon Diffusion into $Al_xGa_{1-x}As$ (X=0–0.4) from a Sputtered Silicon Film", Feb. 2, 1987, pp. 265–266.

Omura Vawter et al, "Selective Double Diffusion of Zn and Si into GaAs Using Sputtered Si Masks", Japanese Journal of Applied Physics, Aug. 20–22, 1986, pp. 141–144.

Greiner et al, "Diffusion of Silicon . . . Experiment and Model", Applied Physics Letters, vol. 44(8), Apr. 15, 1984, pp. 750–752.

Omura et al, "Silicon Diffusion . . . Sputtered Silicon Film", Applied Physics Letters, vol. 50(5), Feb. 2, 1987, pp. 265–266.

Primary Examiner—Brian E. Hearn
Assistant Examiner—Trung Dang
Attorney, Agent, or Firm—Leydig, Voit & Mayer

[57] ABSTRACT

A method of diffusing Si into compound semiconductor from a Si film provided on a surface region of the compound semiconductor, wherein the diffusion is conducted with providing a diffusion stopper layer at a position of predetermined depth from the surface of the compound semiconductor, which stopper layer has a lower diffusion speed than that of the compound semiconductor.

A compound semiconductor device includes a compound semiconductor substrate, a diffusion stopper layer provided on the semiconductor substrate, a compound semiconductor layer provided on the diffusion stopper layer, a Si film provided on the semiconductor layer, and Si diffusion regions into which Si is diffused from the Si film so as to reach the interface between the diffusion stopper layer and the semiconductor substrate.

12 Claims, 3 Drawing Sheets

METHOD OF DIFFUSING SILICON INTO COMPOUND SEMICONDUCTORS AND COMPOUND SEMICONDUCTOR DEVICES

FIELD OF THE INVENTION

The present invention relates to a method of diffusing silicon (Si) into compound semiconductors and compound semiconductor devices and more particularly to controlling diffusion depth with a high degree of reproducibility and precision.

BACKGROUND OF THE INVENTION

FIG. 6 shows a cross-sectional view of a wafer for explaining a prior art method of diffusing Si. In FIG. 6, reference numeral 1 designates an $Al_xGa_{1-x}As$ layer ($0 \leq x < 1$), a III-V group compound semiconductor layer. A Si film 2 is disposed on a surface of the $Al_xGa_{1-x}As$ layer 1 for example, by such a vacuum evaporation method, a CVD method (Chemical Vapor Deposition), or a sputtering method. A protection layer 3 comprising for example, $SiO_2$ or $Si_3N_4$ is disposed on layer 1 and film 2 for protecting the surfaces of the $Al_xGa_{1-x}As$ layer 1 and the Si film 2. Si may be diffused into layer 1 without providing this protection layer 3. Reference numeral 5 designates a region into which Si has been diffused.

The diffusion process will be described.

The $Al_xGa_{1-x}As$ layer 1 having Si film 2 thereon is heated up to a temperature of about 800 to 950° C. in an ambient having arsenic partial pressure of about 0.3 atmosphere. Then, Si diffuses into the $Al_xGa_{1-x}As$ layer 1 at the elevated temperature.

In this prior art diffusion method, diffusion time, diffusion temperature, arsenic pressure, Si film thickness, protection layer thickness, and material of protection layer can be selected as desired, as parameters which determine the diffusion speed and diffusion depth. For example, when the diffusion temperature is low, the arsenic pressure is low, the Si film is thick, and the protection layer is thick, the diffusion speed is low. The reason why the diffusion speed is low when the protection layer is thick is described in "1986 International Conference on Solid State Devices and Materials, pp 41 to 44". Since the annealing is conducted in an As ambient, As diffuses through the protection layer to reach the interface between the protection layer and GaAs layer, thereby creating an As rich (that is, Ga vacancies rich) region in GaAs layer Si will diffuse in association with these vacancies, thereby promoting the diffusion. When the protection layer is thick, As slowly reaches the interface, thereby lowering the diffusion speed.

Furthermore, it is reported in Applied Physics Letters," Volume 44(8), 15 April 1984, pp 750 to 752" and "J. Electron. Soc. Society," Volume 129, No. 4, 1982, pp 837 to 840 that the diffusion speed is lower when using a $Si_3N_4$ protection layer than using a $SiO_2$ protection layer. When an $SiO_2$ protection layer is used, Ga in the GaAs layer is likely to diffuse into $SiO_2$ at the $SiO_2$ protection and GaAs layer interface during annealing. Thus, Ga vacancies will occur in the GaAs layer and Si will diffuse in association with these vacancies, thereby promoting the diffusion. On the other hand, when an $Si_3N_4$ protection layer is used, Ga is not likely to diffuse into $Si_3N_4$. In addition, since annealing is conducted in an As ambient, As will diffuse through the protection layer to reach the $SiO_2$ protection and GaAs layer interface, thereby creating an As rich region in GaAs layer, and Si will diffuse in association with the resulting Ga vacancies, thereby promoting the diffusion. Since an $Si_3N_4$ film is denser than $SiO_2$, As more slowly reaches the interface, thereby reducing the diffusion speed.

When the Si diffusion process is employed in a device, the diffusion depth needs to be precisely controlled. In the prior art diffusion method, however, since the diffusion depth varies dependent on many parameters as described above, it is difficult to control the diffusion depth with a high degree of reproducibility and precision by suppressing variations of these parameters.

SUMMARY OF THE INVENTION

It is an object of the present invention to provide a method of diffusing Si into compound semiconductor, capable of controlling the Si diffusion depth with a high degree of reproducibility and precision.

Another object of the present invention is to provide a compound semiconductor device produced by utilizing such Si diffusion method.

Other objects and advantages of the present invention will become apparent from the detailed description given hereinafter; it should be understood, however, that the detailed description and specific embodiments are given by way of illustration only, since various changes and modifications within the spirit and scope of the invention will become apparent to those skilled in the art from this detailed description.

According to the present invention, Si is diffused into a compound semiconductor with a diffusion limiting layer disposed at a predetermined depth from the surface of the compound semiconductor. The diffusion limiting layer has a slower diffusion speed than that of the compound semiconductor. Then, even when the diffusion time is lengthened less variation in the diffusion depth occurs. Accordingly, by slightly increasing the diffusion time, it is possible to control the diffusion depth with a high degree of reproducibility and precision regardless of variations that arise in the diffusion speed due to variations in diffusion parameters.

DETAILED DESCRIPTION OF THE DRAWINGS

Figure 1:
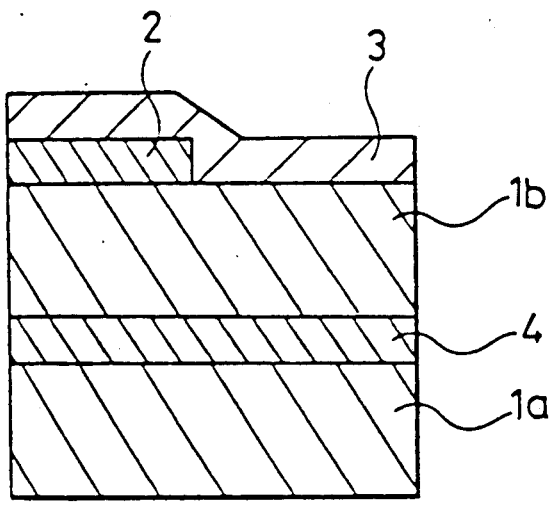
Figure 1:
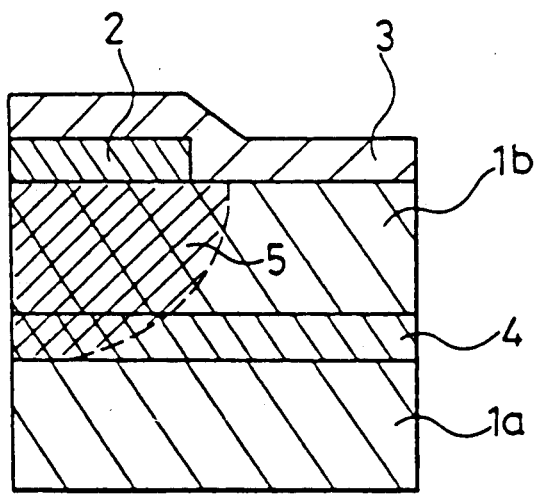
Figure 2:
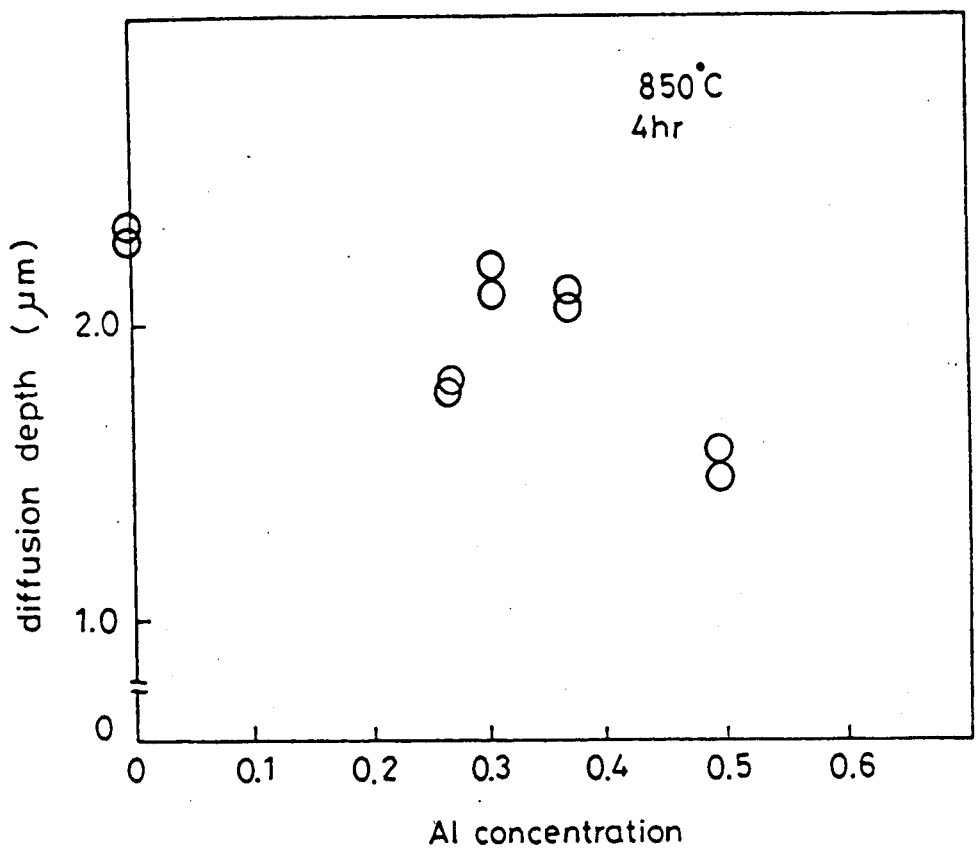
Figure 3:
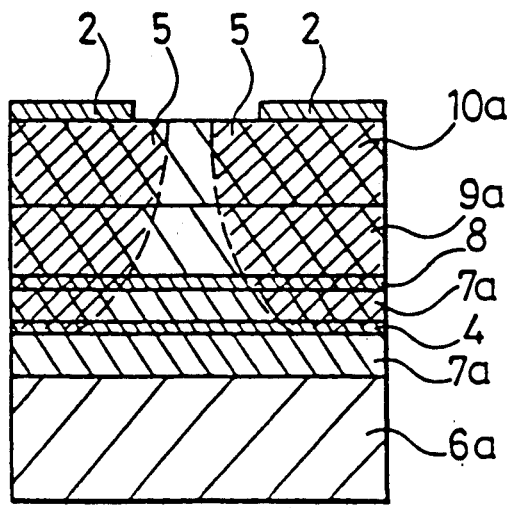
Figure 4:
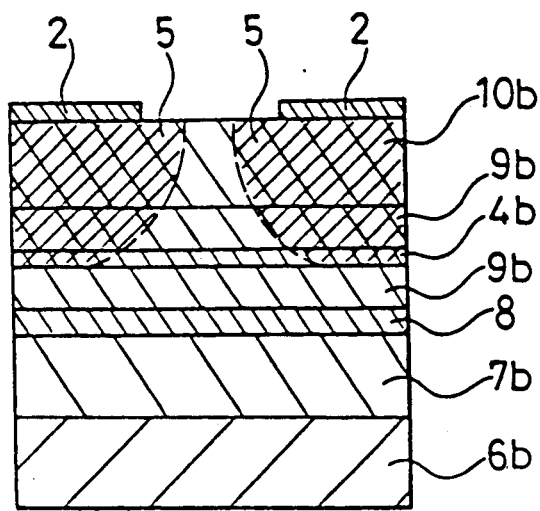
Figure 5:
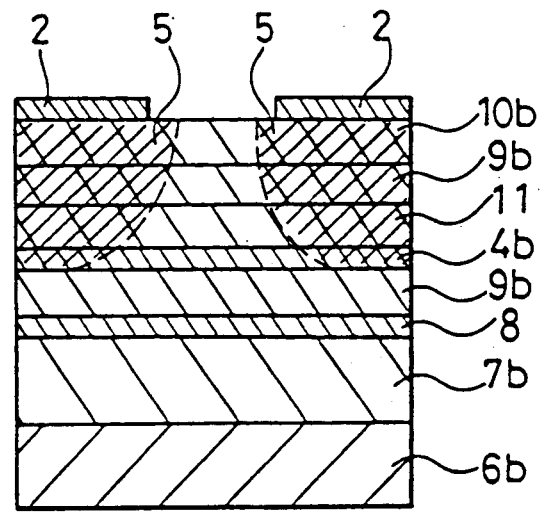
Figure 6:
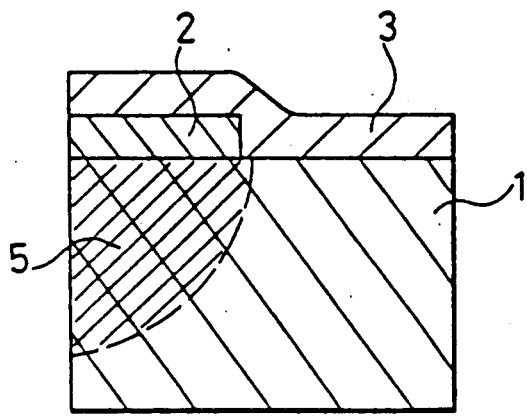

FIGS. 1(a) and (b) are diagrams showing crosssectional views of a wafer for explaining a method of diffusing Si according to a first embodiment of the present invention;

FIG. 2 is a graph showing Al concentration versus diffusion depth characteristics according to the present invention;

FIGS. 3, 4, and 5 are diagrams showing crosssectional views of laser diodes according to a second, a third, and a fourth embodiment of the present invention, respectively; and FIG. 6 is a diagram showing a cross-sectional view of a wafer for explaining a method of diffusing Si according to the prior art.

DETAILED DESCRIPTION OF THE PREFERRED EMBODIMENTS

An embodiment of the present invention will be described in detail with reference to the drawings.

FIGS. 1(a) and (b) show cross-sectional views for explaining a method of diffusing Si according to a first embodiment of the present invention. FIG. 1(a) shows a cross-sectional view of a wafer prior to Si diffusion and FIG. 1(b) shows the wafer into which Si has been diffused.

In FIGS. 1(a) and (b), reference numerals 1a and 1b designate an $Al_xGa_{1-x}As$ substrate and an $Al_xGa_{1-x}As$ layer, respectively, as III–V group compound semiconductor layers. A Si film 2 is disposed on the $Al_xGa_{1-x}As$ layer 1b. A protection layer 3 for protecting the surfaces of the $Al_xGa_{1-x}As$ layer 1b and the Si film 2 is disposed on the surface of layer 1b an Si film 2. A diffusion limiting layer 4 comprising $Al_yGa_{1-y}As$ (y > x) is disposed at a predetermined depth from the surface of the $Al_xGa_{1-x}As$ layer 1b, between layers 1a and 1b. Diffusion limiting layer 4 has a Si diffusion speed than the $Al_xGa_{1-x}As$ layer 1b. Reference numeral 5 designates a Si diffusion region.

The diffusion process will be described.

Si diffusion is generally carried out in a closed quartz ampoule in which arsenic partial pressure is supplied by a metal arsenide, or in an opened quartz ampoule wherein arsenic partial pressure is supplied by injecting arsine ($AsH_3$). Here, the former process is employed. GaAs is employed as a sample, and the protection layer 3 is omitted. Si film 2 is deposited on the GaAs substrate to a thickness of 300 ↑ by a vacuum evaporation method.

The wafer and metal arsenide are set in the quartz ampoule, and the quartz ampoule is evacuated and closed. The weight of metal arsenide is about 40 mg for an ampoule volume of 40 cc. The quartz ampoule is put in the diffusion furnace and diffusion is carried at a temperature of 850° C. in an arsenide ambient having arsenic partial pressure of about 0.3 atmosphere.

As previously described, diffusion depth varies with Si film thickness, arsenic pressure, and temperature. When diffusion is carried out for four hours under the above described condition, Si is diffused to a depth of 2.3 $\mu$m. On the other hand, when diffusion is carried out into a $Al_{0.5}Ga_{0.5}As$ substrate under the same condition Si is diffused up to a depth of only 1.5 $\mu$m. FIG. 2 is a graph showing Al concentration versus diffusion depth characteristics. As is apparent from figure 2, when the Al concentration is high, the diffusion depth is shallow, meaning lower diffusion speed.

If the diffusion depth is set to 2.3 $\mu$m, the diffusion limiting layer 4 of 0.3 $\mu$m thick, comprises $Al_yGa_{1-y}As$ (y ≧ 0.3), and is provided at a little above the diffusion front, (for example, at a position of 2.0 $\mu$m depth), diffusion can be easily stopped by the limiting layer 4. This means that even if a little variation should occur in the Si film thickness, arsenic partial pressure, and diffusion temperature, diffusion to a predetermined depth is realized only by conducting diffusion a little longer than usual, without unfavorable effects.

While in the above-illustrated embodiment the process of Si diffusion into GaAs layer is discussed, Si diffusion into $Al_xGa_{1-x}As$ layer will be carried out by the similar process. In this case, diffusion depth can be easily controlled with providing a diffusion limiting stopper layer 4 comprising $Al_yGa_{1-y}As$ (y ≧ x + 0.3).

FIG. 3 shows a cross-sectional view of a laser diode as a second embodiment of the present invention, wherein the Si diffusion method of the present invention is employed. In FIG. 3, reference numeral 6a designates a p type GaAs substrate. A p type $Al_{0.42}Ga_{0.58}As$ (or $Al_{0.33}Ga_{0.67}As$) lower cladding layer 7a is disposed on the substrate 6a. A diffusion limiting layer 4 about 0.1 $\mu$m, thick comprising p type $Al_{0.72}Ga_{0.28}As$ (or $Al_{0.63}Ga_{0.37}As$) is disposed at a position of 0.5 to 1 $\mu$m distance from an active layer 8 and between the upper and lower portions of the lower cladding layer 7a. A p type $Al_{0.08}Ga_{0.92}As$ (or GaAs) active layer 8 is disposed on the upper portion of the lower cladding layer 7a. An n type $Al_{0.42}Ga_{0.58}As$ (or $Al_{0.33}Ga_{0.67}As$) upper cladding layer 9a is disposed on the active layer 8. An n type GaAs contact layer 10a is disposed on the upper cladding layer 9a. Spaced apart Si films 2 are provided on the contact layer 10a. Reference numeral 5 designates Si diffusion regions.

In this laser diode, since the diffusion limiting layer 4 is provided at a position farther away from Si films 2 than the active layer 8. Since the Si films are spaced apart, two Si diffusion in the active layer 8 regions are formed having a lower refractive index than that of the central portion of the active layer 8, into which no Si is diffused. That division of the active layer 8 produces a light waveguide structure.

FIG. 4 shows a cross-sectional view of a laser diode as a third embodiment of the present invention, wherein the Si diffusion method of the present invention is employed. In FIG. 4, reference numeral 6b designates an n type GaAs substrate. An n type $Al_{0.42}Ga_{0.58}As$ (or $Al_{0.33}Ga_{0.67}As$) lower cladding layer 7b is disposed on the substrate 6b. A p type $Al_{0.08}Ga_{0.92}As$ (or GaAs) active layer 8 is disposed on the lower cladding layer 7b. A p type $Al_{0.42}Ga_{0.58}As$ (or $Al_{0.33}Ga_{0.67}As$) upper cladding layer 9b is disposed on the $\mu$m, thick which comprises $Al_{0.72}Ga_{0.28}As$ (or $Al_{0.63}Ga_{0.37}As$) is disposed at a position of 0.2 to 0.3 l$\mu$m distance from the active layer 8 and between the upper and lower portions of the upper cladding layer 9b. A p type GaAs contact layer 10b is disposed on the upper portion of the upper cladding layer 9b.

In this laser diode, the transverse mode of oscillation is controlled by the spatial distribution of Si that is produced by the Si diffusion. The portions of the upper cladding layer 9b and the diffusion stopper layer 4b into which Si diffuses have a lower refractive index than of the other portions of the cladding layer 9b and the stopper layer 4b. When the portions of high refractive index and low refractive index exist near the active layer, the active layer 8 has a refractive index variation in the transverse direction that confines the light in the center of the laser chip. Accordingly, the transverse mode oscillation structure can be controlled by controlling the diffusion depth, as well as the longitudinal direction mode oscillation. As discussed above, the distance between the diffusion front and the active layer strongly affects the laser diode characteristics, so that control of diffusion depth is of great importance, giving the present invention significant utility.

FIG. 5 shows a cross-sectional view of a laser diode having the structure of figure 4 and including further lightguide layer 11 In this laser diode, the lightguide layer 11 comprising AlGaAs series superlattice is disposed between the diffusion limiting layer 4b and the upper cladding layer 9b. The superlattice is disordered in the Si diffusion region 5, and becomes a mixed crystal of relatively uniform composition. The distinctions between the layers of the superlattice are destroyed in the Si diffusion so that a relatively homogeneous crystalline composition is formed in the portions of cladding layer 9b that are included in Si diffusion regions 5. Since the mixed crystal portions have a refractive index which is different from that of the other portion of the superlattice, a light waveguide structure is produced. In this structure, the diffusion limiting layer 4 is disposed adjacent the light guide layer 11 and farther from Si films 2. The Si diffusion is precisely stopped by the limiting layer 4, thereby obtaining a laser diode with a high degree of reproducibility with uniform characteristics.

While AlGaAs series compound semiconductor is described above, the present invention may be applied to InGaAsP or AlGaInP series compound semiconductor having a diffusion limiting layer with a composition ratio different from that of the compound semiconductor and of lower diffusion speed than that of the compound semiconductor.

As discussed above, according to the present invention, Si diffusion into a compound semiconductor is carried out with a diffusion limiting layer disposed at a position of predetermined depth from the surface of the compound semiconductor, the diffusion limiting layer having a lower diffusion speed than that of the compound semiconductor. Thus, the diffusion depth can be controlled with a high degree of reproducibility and precision.

What is claimed is:

1. A method of diffusing silicon into a compound semiconductor comprising:
   forming a silicon diffusion limiting layer in the body of a compound semiconductor having a surface remote from said layer, said layer having a slower silicon diffusion rate than said semiconductor;
   disposing a silicon film at each of two spaced apart regions on said surface; and
   diffusing silicon into said semiconductor from said film at an elevated temperature for sufficient time so that the diffusing silicon penetrates into but not through said layer.

2. A method of diffusing silicon into a compound semiconductor as defined in claim 1, wherein said compound semiconductor comprises $Al_xGa_1As$, and said diffusionn limiting layer comprises $Al_yGa_{1-y}As$ ($x<y$).

3. A method of diffusing silicon into a compound semiconductor as defined in claim 1, wherein said compound semiconductor comprises $In_{1-x}Ga_xAs_yP_{1-y}$.

4. A method of diffusing silicon into a compound semiconductor as defined in claim 1, wherein said compound semiconductor comprises $(Al_xGa_{1-x})_yIn_{1-y}P$.

5. A method of diffusing silicon into a compound semiconductor as defined inn claim 2 wherein $y \geq x+0.3$.

6. A method of forming a light confinement region in a semiconductor laser successively including a substrate, a p-type compound semiconductor first cladding layer, a p-type compound semiconductor active layer, and an n-type compound semiconductor second cladding layer comprising:
   disposing a silicon diffusion limiting layer within said first cladding layer;
   disposing a layer of silicon at each of two spaced apart regions on said second cladding layer; and
   diffusing silicon from said silicon layer at an elevated temperature for a sufficient time so that the diffusing silicon penetrates through said second cladding and active layers into said first cladding layer and penetrates into but not through said diffusionn limiting layer to convert regions of said active and first cladding layers to n-type conductivity, leaving p-type regions of said active and first cladding layers between the converted regions that define a light confinement region.

7. A method as defined in claim 6 wherein said compound semiconductor is $Al_zGa_{1-z}As$ ($O_2 \leq \leq 1$), the aluminum concentration is higher said first and second cladding layers than in said active layer, and the aluminum concentration is highest in said diffusion limiting layer.

8. A method as defined in claim 7 wherein said first cladding layer is $Al_xGa_{1-x}As$, said diffusion limiting layer is $Al_yGa_{1-y}As$, and $y \geq x+0.3$.

9. A method of forming a light confinement region in a semiconductor laser successively including a compound semiconductor substrate, an n-type compound semiconductor first cladding layer, a compound semiconductor active layer, a p-type compound semiconductor second cladding layer, and a p-type contacting layer comprising:
   disposing a silicon diffusion limiting layer within said second cladding layer;
   disposing a layer of silicon at each of two spaced apart regions on said p-type cladding layer; and
   diffusing silicon from said silicon layer at an elevated temperature for a sufficient time so that the diffusing silicon penetrates through said contacting layer into said first cladding layer and penetrates into but not through said diffusion limiting layer to convert regions of said first cladding layer to n-type conductivity, leaving p-type regions of said contact and first cladding layers between the converted regions that define a light confinement region.

10. A method as defined in claim 9 wherein said compound semiconductor is $Al_zGa_{1-z}As$ ($O \leq z \leq 1$), the aluminum concentration is higher said first and second cladding layers than in said active layer, and the aluminum concentration is highest in said diffusion limiting layer.

11. A method as defined in claim 10 wherein said second cladding layer is $Al_xGa_{1-x}As$, said diffusion limiting layer is $Al_yGa_{1-y}As$, and $y \geq x+0.3$.

12. A method as defined in claim 9 wherein the semiconductor laser includes a light guide superlattice layer disposed within the second cladding layer adjacent and on the side of said diffusion limiting layer toward said contacting layer including diffusing silicon through two spaced apart regions of said light guide superlattice layer to disorder and convert regions of said light guide superlattice layer to n-type conductivity when silicon is diffused into said second cladding layer, leaving a p-type region of said light guide superlattice layer as part of the light confinement region.

* * * * *

UNITED STATES PATENT AND TRADEMARK OFFICE
CERTIFICATE OF CORRECTION

PATENT NO. : 5,047,366

DATED : September 10, 1991

INVENTOR(S) : Takashi Murakami

It is certified that error appears in the above-identified patent and that said Letters Patent is hereby corrected as shown below:

Column 5, line 39, change "$Al_xGa_1As$" to --$Al_xGa_{1-x}As$--;
line 40, change "diffusionn" to --diffusion--;
line 49, change "inn" to --in--;

Column 6, line 5, change "diffusionn" to --diffusion--;
line 12, change "($0_2 \leq \leq 1$)" to --($0 \leq z \leq 1$)--.

Signed and Sealed this

Second Day of March, 1993

*Attest:*

STEPHEN G. KUNIN

*Attesting Officer*    *Acting Commissioner of Patents and Trademarks*